United States Patent
Kaneyama

(10) Patent No.: US 9,064,914 B2
(45) Date of Patent: Jun. 23, 2015

(54) METHOD OF AND APPARATUS FOR HEAT-TREATING EXPOSED SUBSTRATE

(75) Inventor: Koji Kaneyama, Kyoto (JP)

(73) Assignee: SCREEN Semiconductor Solutions Co., Ltd. (JP)

( * ) Notice: Subject to any disclaimer, the term of this patent is extended or adjusted under 35 U.S.C. 154(b) by 0 days.

(21) Appl. No.: 13/239,529

(22) Filed: Sep. 22, 2011

(65) Prior Publication Data

US 2012/0091110 A1    Apr. 19, 2012

(30) Foreign Application Priority Data

Oct. 14, 2010  (JP) ................................ 2010-231108

(51) Int. Cl.
  H05B 1/00   (2006.01)
  H05B 3/00   (2006.01)
  H05B 11/00  (2006.01)
  F26B 3/30   (2006.01)
  F26B 19/00  (2006.01)
  H01L 21/67  (2006.01)
  G03F 7/38   (2006.01)

(52) U.S. Cl.
  CPC ............ *H01L 21/67178* (2013.01); *G03F 7/38* (2013.01); *H01L 21/67115* (2013.01); *H01L 21/67184* (2013.01)

(58) Field of Classification Search
  USPC .................. 219/201, 399, 411; 392/416, 418; 118/724, 725; 165/61; 432/247–265
  See application file for complete search history.

(56) References Cited

U.S. PATENT DOCUMENTS

| 4,922,078 A | * | 5/1990 | Ulrich et al. | 219/216 |
| 5,656,229 A | * | 8/1997 | Tanimoto et al. | 264/400 |
| 6,002,108 A | | 12/1999 | Yoshioka | |
| 6,100,012 A | | 8/2000 | Shi | |

(Continued)

FOREIGN PATENT DOCUMENTS

| JP | H 05-127371 | 5/1993 |
| JP | 05-259064   | 10/1993 |

(Continued)

OTHER PUBLICATIONS

Office Action dated Jan. 8, 2013 in corresponding Korean Patent Application No. 10-2011-0071326 with Japanese and English translations.

(Continued)

*Primary Examiner* — Dana Ross
*Assistant Examiner* — Lindsey C Teaters
(74) *Attorney, Agent, or Firm* — Ostrolenk Faber LLP

(57) ABSTRACT

A substrate subjected to a pattern exposure process is transported to a flash bake unit. The flash bake unit performs a post-exposure bake process in which flashes of light are directed from flash lamps onto a surface of the substrate held on an upper surface of a cooling plate to momentarily heat the surface of the substrate, thereby causing crosslinking, deprotection or decomposition and the like of resist resin to proceed by using active species produced in a resist film by a photochemical reaction during the pattern exposure process as an acid catalyst, so that the solubility of only the exposed portion of the resist film in a developing solution is locally changed. The flash heating treatment performed by the irradiation with flashes of light requires extremely short treatment time of not greater than one second. This reduces the diffusion length of acid during the post-exposure bake process.

7 Claims, 8 Drawing Sheets

(56) References Cited

U.S. PATENT DOCUMENTS

| | | | |
|---|---|---|---|
| 6,261,744 | B1 | 7/2001 | Yoshioka |
| 6,998,580 | B2 | 2/2006 | Kusuda et al. |
| 7,009,148 | B2 | 3/2006 | Kawano et al. ............... 219/411 |
| 7,090,963 | B2 | 8/2006 | Medeiros et al. |
| 8,198,005 | B2 | 6/2012 | Shiobara et al. |
| 2004/0105081 | A1* | 6/2004 | Schenau .................... 355/53 |
| 2006/0269879 | A1 | 11/2006 | Elian et al. |
| 2007/0224839 | A1* | 9/2007 | Shimizu .................... 438/795 |
| 2008/0117390 | A1* | 5/2008 | Kaneko et al. ................. 355/27 |
| 2008/0220379 | A1 | 9/2008 | Nomura |
| 2009/0060686 | A1 | 3/2009 | Morita et al. |
| 2009/0305174 | A1 | 12/2009 | Shiobara et al. |
| 2014/0329340 | A1* | 11/2014 | Yokouchi ..................... 438/10 |

FOREIGN PATENT DOCUMENTS

| | | |
|---|---|---|
| JP | 06-337128 | 12/1994 |
| JP | 10-261558 | 9/1998 |
| JP | 2000-507046 | 6/2000 |
| JP | 2001-332484 | 11/2001 |
| JP | 2004-134674 | 4/2004 |
| JP | 2007-292726 | 11/2007 |
| JP | 2008-218866 | 9/2008 |
| JP | 2008-235535 | 10/2008 |
| JP | 2008-543033 | 11/2008 |
| JP | 2009-294439 | 12/2009 |
| KR | 10-0590355 | 6/2006 |
| KR | 10-0590355 | 9/2006 |
| KR | 10-2008-0085727 | 9/2008 |
| WO | WO 97/35231 | 9/1997 |

OTHER PUBLICATIONS

Japanese Office Action dated Apr. 8, 2014 in corresponding Japanese Patent Application No. JP2010-231108 (with partial English language translation).

Office Action issued by Korean Patent Office on Jul. 18, 2013 in connection with corresponding Korean Patent Application No. 10-2011-0071326 with Japanese and English Translation thereof.

Office Action issued by Taiwan Patent Office on Oct. 30, 2014 in connection with corresponding Taiwan Patent Application No. 100127450 with Japanese and English Translation thereof.

Office Action issued by Korean Patent Office on Nov. 11, 2013 in connection with corresponding Korean Patent Application No. 10-2011-0071326 with Japanese and English Translation thereof.

Japanese Office Action dated Dec. 10, 2013 in corresponding Japanese Patent Application No. JP2010-231108 (with partial English language translation).

Korean Office Action dated May 19, 2014 in corresponding Korean Patent Application No. JP2010-231108 (with partial Japanese and English language translations).

Korean Office Action dated May 19, 2014 in corresponding Korean Patent Application No. 10-2011-0071326. (with partial Japanese and English language translations).

Office Action issued by Korean Patent Office on Dec. 29, 2014 in connection with corresponding Korean Application No. 10-2011-0071326 with Japanese and English Translation thereof.

* cited by examiner

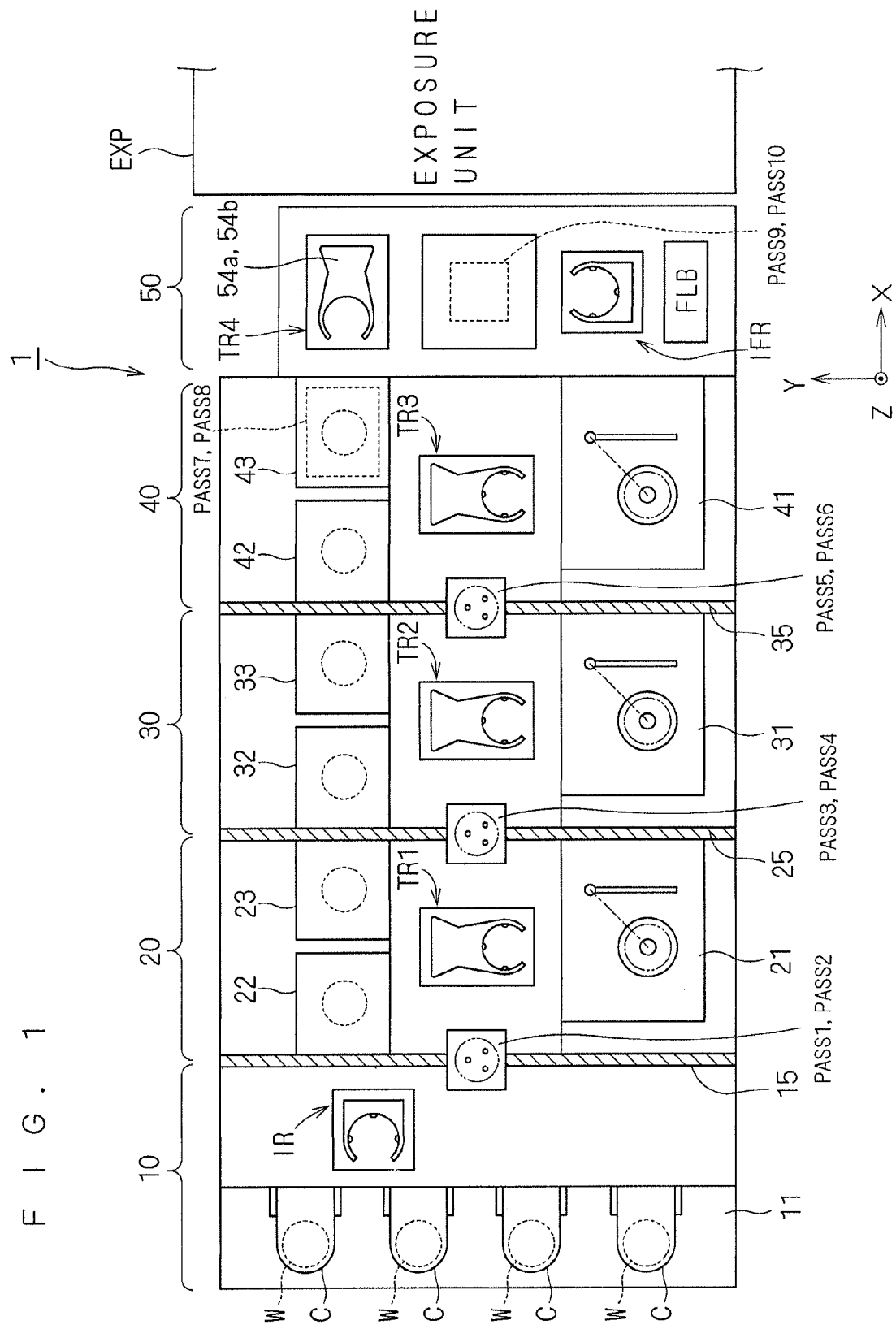
F I G . 1

F I G . 7
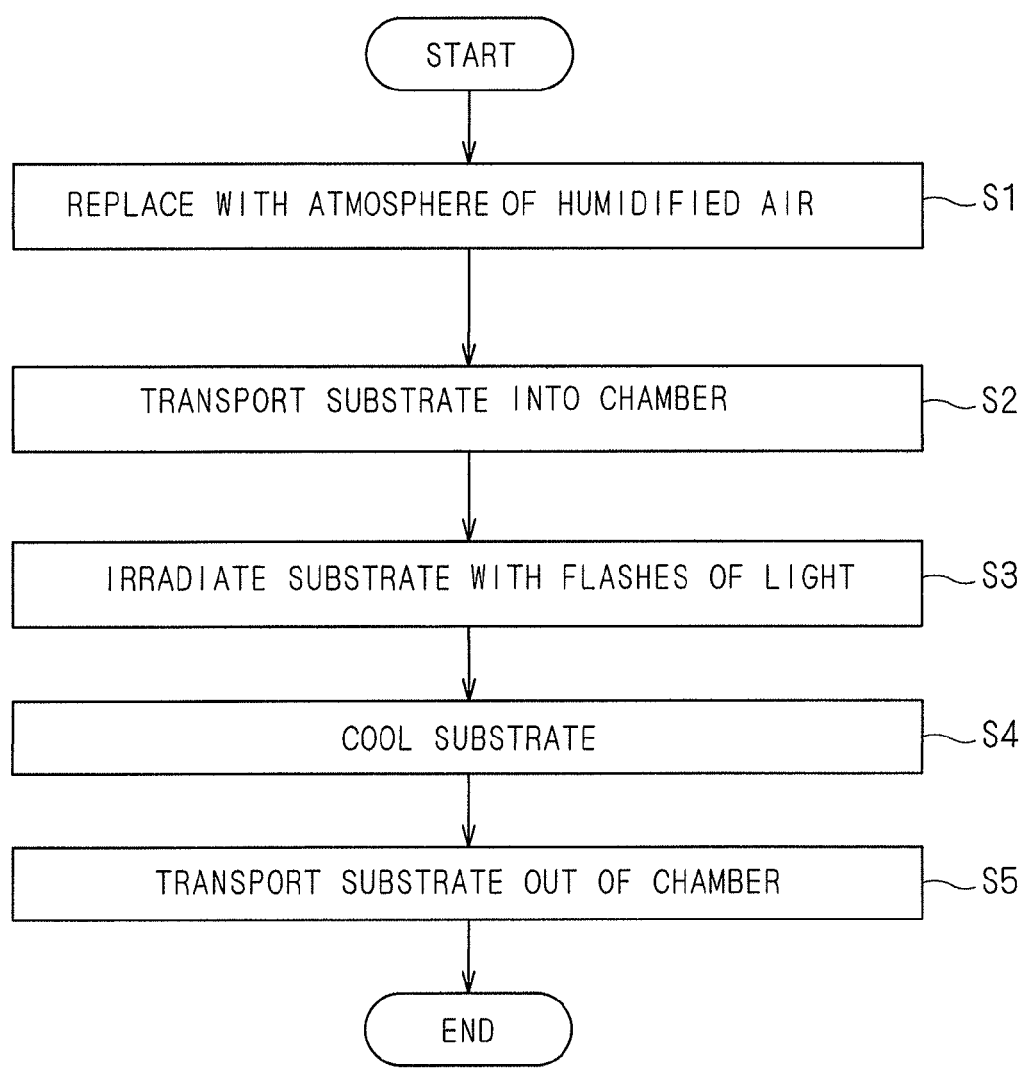

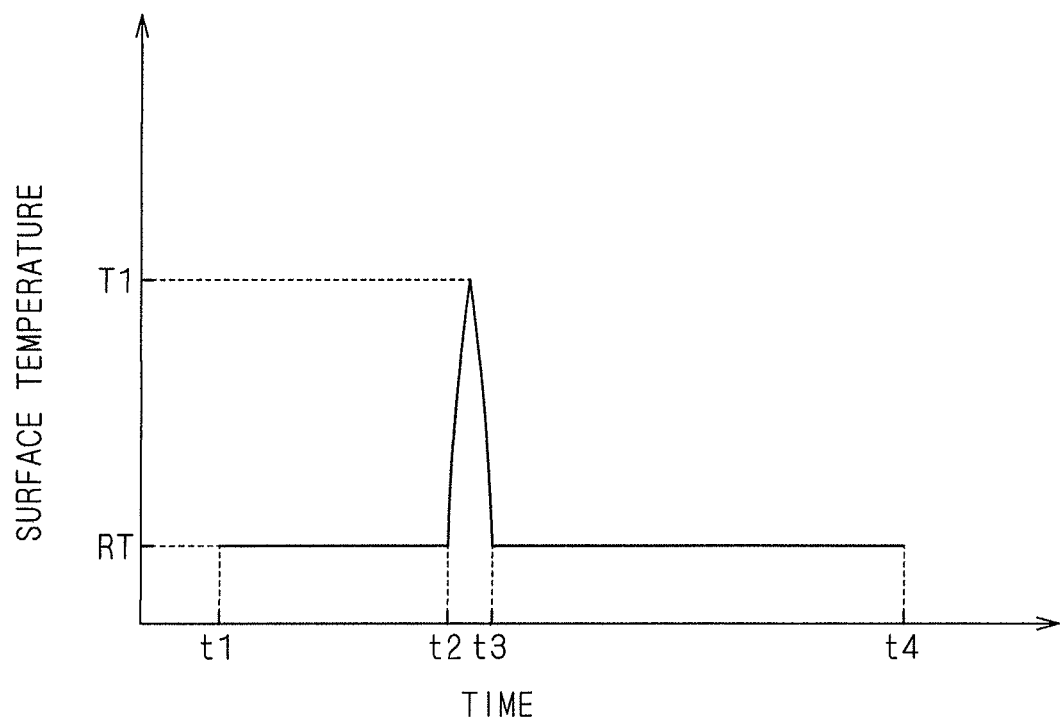
F I G . 8

METHOD OF AND APPARATUS FOR HEAT-TREATING EXPOSED SUBSTRATE

BACKGROUND OF THE INVENTION

1. Field of the Invention

The present invention relates to a heat treatment method and a heat treatment apparatus for performing a post-exposure bake process on a thin plate-like precision electronic substrate such as a semiconductor wafer and a glass substrate for a liquid crystal display device (hereinafter referred to simply as a "substrate").

2. Description of the Background Art

Products of semiconductor devices, liquid crystal display devices and the like are fabricated by performing a series of processes including cleaning, resist coating, exposure, development, etching, interlayer insulation film formation, heat treatment, dicing and the like on the aforementioned substrate. A substrate processing apparatus which performs, among the aforementioned processes, a resist coating process on a substrate to transfer the substrate to an exposure unit and which receives an exposed substrate from the exposure unit to perform a development process on the exposed substrate is widely used as what is called a coater-and-developer. U.S. Patent Application Publication No. 2009/060686 discloses an example of such a substrate processing apparatus.

For a coater-and-developer adaptable to an exposure unit which uses ArF and KrF excimer laser, it is essential to form a film of chemically amplified resist on a substrate to transfer the substrate with the film formed thereon to the exposure unit and to perform a post-exposure bake (PEB) process on an exposed substrate. U.S. Patent Application Publication No. 2009/060686 discloses the execution of a post-exposure bake process which causes a reaction such as crosslinking, deprotection or decomposition and the like of resist resin to proceed by using a product formed by a photochemical reaction during the exposure process as an acid catalyst, thereby locally changing the solubility of only the exposed portion of the resist resin in a developing solution. Also, U.S. Pat. No. 7,009,148 discloses that a post-exposure bake process is performed by scanning a substrate with a laser.

As disclosed also in U.S. Patent Application Publication No. 2009/060686, the conventional post-exposure bake process has been performed by placing an exposed substrate on a hot plate controlled at a predetermined heating temperature for a predetermined period of time. The heating temperature of the hot plate in a typical post-exposure bake process is approximately 130° C.

As pattern dimensions have become finer in recent years, it has been contemplated to minimize a diffusion length for which acid generated in a resist film during a pattern exposure process is diffused in a post-exposure bake process. General techniques for minimizing the diffusion length are to decrease a processing temperature in the post-exposure bake process and to shorten processing time for the post-exposure bake process. However, the decrease in processing temperature causes the post-exposure bake process itself to be susceptible to environmental effects, thereby giving rise to an apprehension that the temperature uniformity of a substrate deteriorates.

In addition, the decrease in processing temperature causes non diffusion of the acid, as a result, the formation of the photoresist pattern might become incomplete.

For this reason, it is desirable to shorten the processing time for the post-exposure bake process. However, when a substrate is placed on a hot plate and heated, it takes at least 30 seconds or more for the temperature of the substrate to reach an intended heating temperature. Thus, there is a limit to the shortening of the processing time. When an attempt is made to shorten the processing time beyond the limit, there arises a problem such that the dimension accuracy also decreases.

In the post-exposure bake process using the laser as disclosed in U.S. Pat. No. 7,009,148, a region irradiated with the laser is limited. It is hence difficult to process the entire surface of the substrate at a time, but it is necessary to scan the substrate with the laser. This produces a time difference between a start position and an end position for the post-exposure bake process to cause a problem in nonuniform pattern dimensions. Also, the need for scanning increases the processing time to result in an apprehension about the reduction in throughput.

SUMMARY OF THE INVENTION

The present invention is intended for a method of heat-treating an exposed substrate by performing a post-exposure bake process on the exposed substrate.

According to one aspect of the present invention, the method comprises the steps of: (a) putting a substrate into a chamber after a chemically amplified resist film formed on a surface of the substrate is exposed to light; and (b) irradiating the surface of the substrate put in the chamber with flashes of light to perform a post-exposure bake process.

The post-exposure bake process is performed by irradiating the surface of the substrate with flashes of light. This significantly reduces the time required for the post-exposure bake process to reduce the diffusion length of acid during the post-exposure bake process.

Preferably, the substrate is irradiated with flashes of light in the step (b) while being held on a cooling plate in the chamber.

This provides temperature history uniformity between a plurality of substrates to be treated in succession.

Preferably, light with a wavelength less than 300 nm is removed from the flashes of light directed onto the surface of the substrate in the step (b).

This prevents the chemically amplified resist film from reacting to the flashes of light during the post-exposure bake process with reliability.

The present invention is also intended for a heat treatment apparatus for performing a post-exposure bake process on an exposed substrate.

According to one aspect of the present invention, the heat treatment apparatus comprises: a chamber for receiving therein a substrate having a surface provided with a chemically amplified resist film exposed to light; a cooling plate for placing and holding the substrate thereon in the chamber; an exhaust part for exhausting air from the chamber; a humidified air supply part for supplying humidified air into the chamber; a flash lamp for irradiating the substrate held on the cooling plate with flashes of light; and a filter for removing light with a wavelength less than 300 nm from the flashes of light directed from the flash lamp onto the substrate.

The heat treatment apparatus includes the flash lamp for irradiating the substrate held on the cooling plate with flashes of light. The post-exposure bake process is performed by irradiating the surface of the substrate with flashes of light for a short period of time. This reduces the diffusion length of acid during the post-exposure bake process. The heat treatment apparatus further includes the filter for removing light with a wavelength less than 300 nm from the flashes of light. This prevents the chemically amplified resist film from reacting to the flashes of light during the post-exposure bake process.

It is therefore an object of the present invention to minimize the diffusion length of acid during a post-exposure bake process.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view of a substrate processing apparatus with a heat treatment apparatus incorporated therein according to the present invention;

FIG. 7 is a flow diagram showing a procedure for processing a substrate in the flash bake unit; and FIG. 8 is a graph showing changes in the surface temperature of a substrate.

DESCRIPTION OF THE PREFERRED EMBODIMENTS

A preferred embodiment according to the present invention will now be described in detail with reference to the drawings.

Figure 2:
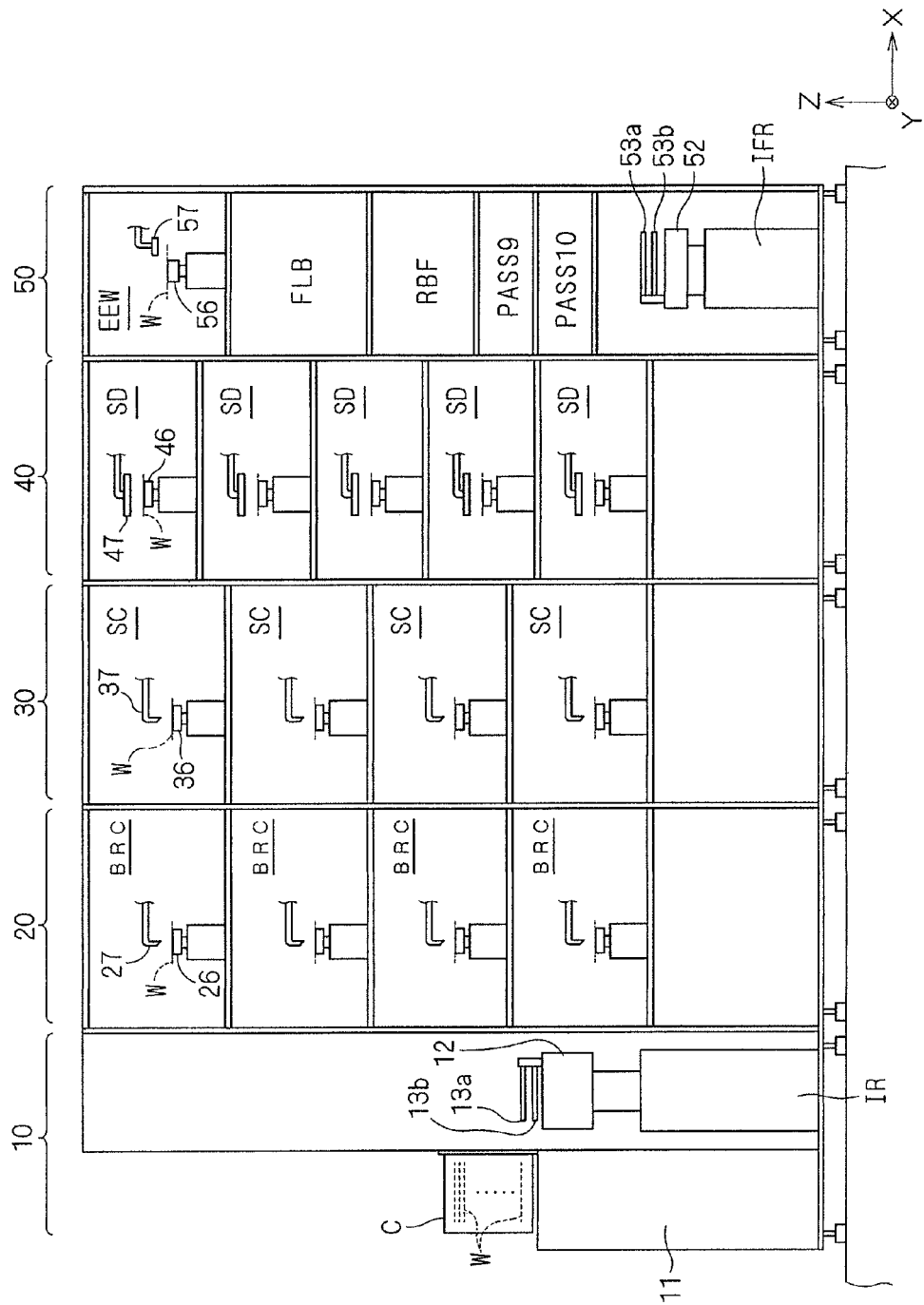
FIG. 2 is a front view of a liquid processing part in the substrate processing apparatus of FIG. 1.
Figure 3:
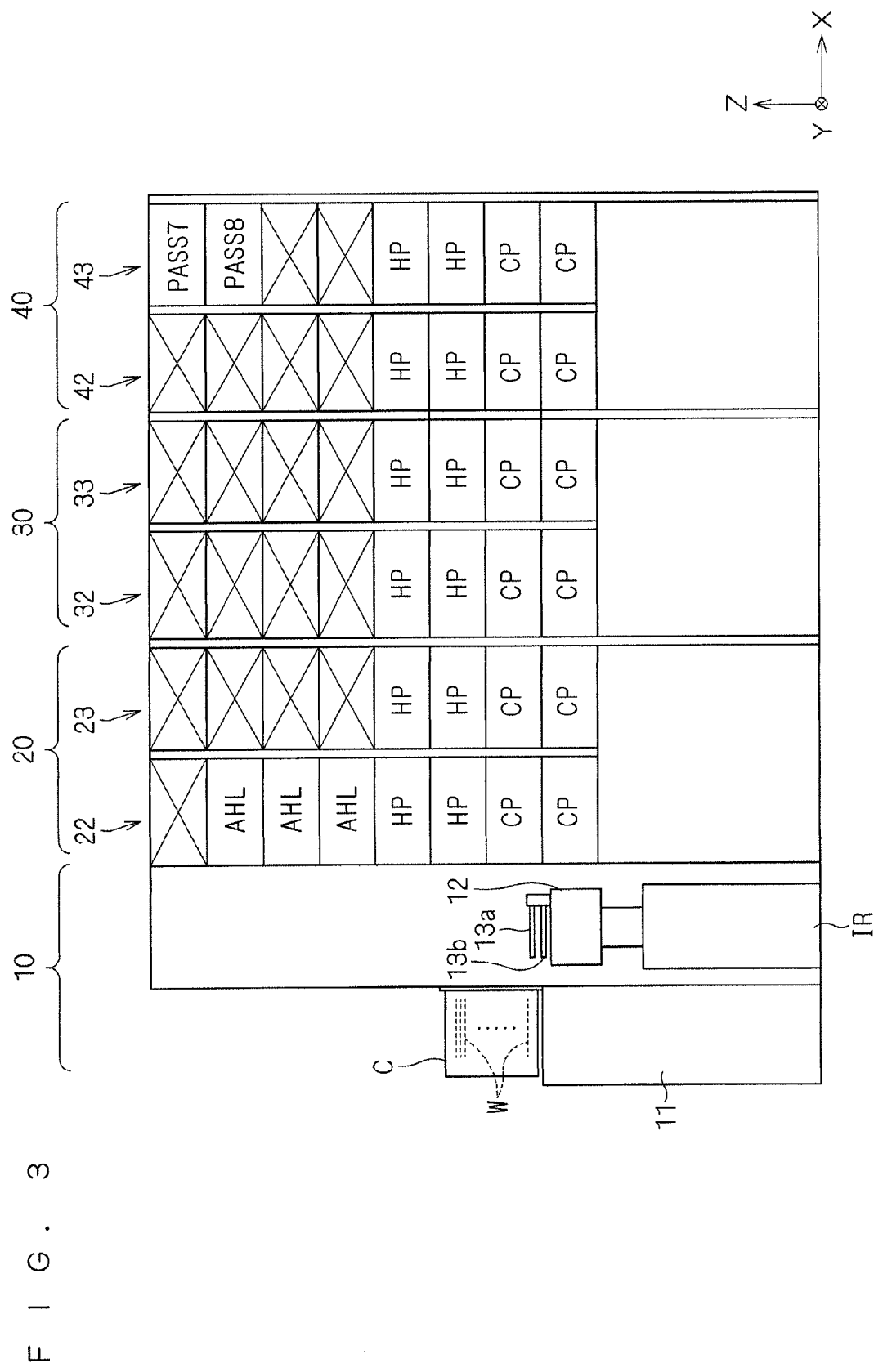
FIG. 3 is a front view of a heat treatment part in the substrate processing apparatus of FIG. 1.
Figure 4:
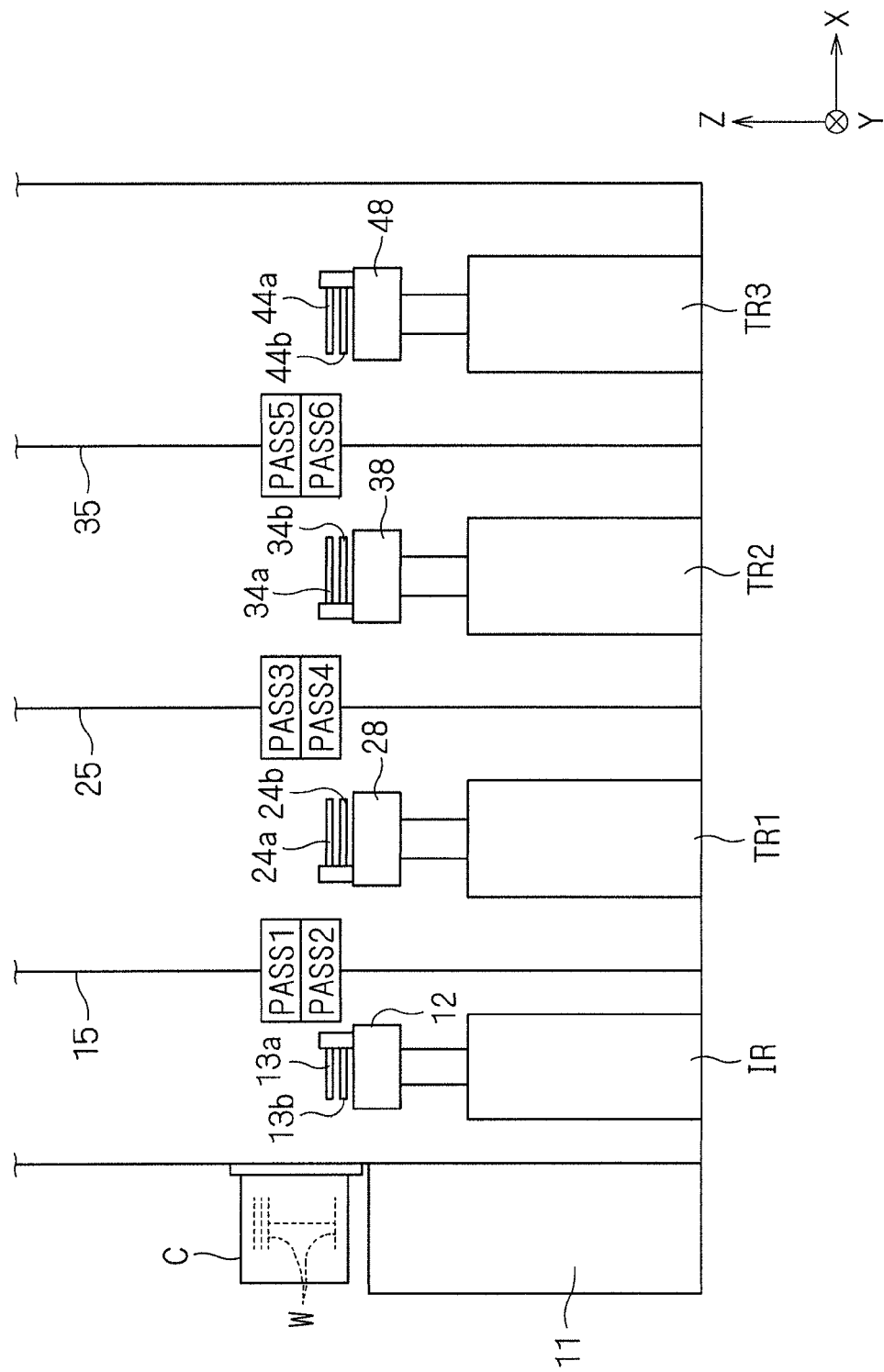
FIG. 4 is a view showing an arrangement of transport robots and substirate rest parts in the substrate processing apparatus of FIG. 1.

First, the overall construction of a substrate processing apparatus with a heat treatment apparatus incorporated therein according to the present invention will be described. FIG. 1 is a plan view of a substrate processing apparatus A1 with a heat treatment apparatus incorporated therein according to the present invention. FIG. 2 is a front view of a liquid processing part in the substrate processing apparatus 1. FIG. 3 is a front view of a heat treatment part in the substrate processing apparatus 1. FIG. 4 is a view showing an arrangement of transport robots and substrate rest parts in the substrate processing apparatus 1. An XYZ rectangular coordinate system in which an XY plane is defined as the horizontal plane and a Z axis is defined to extend in the vertical direction is additionally shown in FIG. 1 and the subsequent figures for purposes of clarifying the directional relationship therebetween. Also, the dimensions of components and the number of components are shown in exaggeration or in simplified form, as appropriate, in FIG. 1 and the subsequent figures for the sake of easier understanding.

The substrate processing apparatus 1 according to the present preferred embodiment is an apparatus (what is called a coater-and-developer) for forming a photoresist film on substrates W such as semiconductor wafers by coating and for performing a development process on substrates W subjected to a pattern exposure process. The substrates W to be processed by the substrate processing apparatus 1 according to the present invention are not limited to semiconductor wafers, but may include glass substrates for liquid crystal display devices, glass substrates for photomasks, and the like.

The substrate processing apparatus 1 according to the present preferred embodiment includes an indexer block 10, a BARC (bottom anti-reflective coating) block 20, a resist coating block 30, a development processing block 40, and an interface block 50. In the substrate processing apparatus 1, the five processing blocks 10, 20, 30, 40 and 50 are disposed in series in one direction (in the X direction). An exposure unit (or stepper) EXP which is an external apparatus separate from the substrate processing apparatus 1 is provided and connected to the interface block 50.

The indexer block 10 is a processing block for transporting unprocessed substrates received from the outside of the substrate processing apparatus 1 into the substrate processing apparatus 1, and for transporting processed substrates subjected to a development process to the outside of the substrate processing apparatus 1. The indexer block 10 includes a table 11 for placing thereon a plurality of (in this preferred embodiment, four) cassettes (or carriers) C in juxtaposition, and an indexer robot IR for taking an unprocessed substrate W out of each of the cassettes C and for storing a processed substrate W into each of the cassettes C.

The indexer robot IR includes a movable base 12 movable horizontally (in the Y direction) along the table 11, movable upwardly and downwardly (in the Z direction), and rotatable about a vertical axis. Two holding arms 13a and 13b each for holding a substrate W in a horizontal position are mounted on the movable base 12. The holding arms 13a and 13b are slidable forwardly and backwardly independently of each other. Thus, each of the holding arms 13a and 13b moves horizontally in the Y direction, moves upwardly and downwardly, pivots within a horizontal plane, and moves back and forth in the direction of the pivot radius. The indexer robot IR is therefore capable of causing the holding arms 13a and 13b to individually gain access to each of the cassettes C, thereby taking an unprocessed substrate W out of each cassette C and storing a processed substrate W into each cassette C. The cassettes C may be of the following types: an SMIF (standard mechanical interface) pod, and an OC (open cassette) which exposes stored substrates W to the outside atmosphere, in addition to a FOUP (front opening unified pod) which stores substrates W in an enclosed or sealed space.

The BARC block 20 is provided in adjacent relation to the indexer block 10. A partition 15 for closing off the communication of atmosphere is provided between the indexer block 10 and the BARC block 20. The partition 15 is provided with a pair of vertically arranged substrate rest parts PASS1 and PASS2 each for placing a substrate W thereon for the transfer of the substrate W between the indexer block 10 and the BARC block 20.

The upper substrate rest part PASS1 is used for the transport of a substrate W from the indexer block 10 to the BARC block 20. The substrate rest part PASS1 includes three support pins. The indexer robot IR in the indexer block 10 places an unprocessed substrate W taken out of one of the cassettes C onto the three support pins of the substrate rest part PASS1. A transport robot TR1 provided in the BARC block 20 which will be described later receives the substrate W placed on the substrate rest part PASS1. The lower substrate rest part PASS2, on the other hand, is used for the transport of a substrate W from the BARC block 20 to the indexer block 10. The substrate rest part PASS2 also includes three support pins. The transport robot TR1 in the BARC block 20 places a processed substrate W onto the three support pins of the substrate rest part PASS2. The indexer robot IR receives the substrate W placed on the substrate rest part PASS2 and stores the substrate W into one of the cassettes C. Pairs of substrate rest parts PASS3 to PASS10 to be described later are similar in construction to the pair of substrate rest parts PASS1 and PASS2.

The substrate rest parts PASS1 and PASS2 extend through the partition 15. Each of the substrate rest parts PASS1 and PASS2 includes an optical sensor (not shown) for detecting the presence or absence of a substrate W thereon. Based on a detection signal from each of the sensors, a judgment is made as to whether or not the indexer robot IR and the transport robot TR1 stand ready to transfer and receive a substrate W to and from the substrate rest parts PASS1 and PASS2.

Next, the BARC block 20 will be described. The BARC block 20 is a processing block for forming an anti-reflective film by coating at the bottom of a photoresist film (i.e., as an undercoating film for the photoresist film) to reduce standing waves or halation occurring during exposure. The BARC block 20 includes a bottom coating processor 21 for coating the surface of a substrate W with the anti-reflective film, a pair of heat treatment towers 22 and 23 for performing a heat treatment which accompanies the formation of the anti-reflective film by coating, and the transport robot TR1 for transferring and receiving a substrate W to and from the bottom coating processor 21 and the pair of heat treatment towers 22 and 23.

In the BARC block 20, the bottom coating processor 21 and the pair of heat treatment towers 22 and 23 are arranged on opposite sides of the transport robot TR1. Specifically, the bottom coating processor 21 is on the front side (on the (−Y) side) of the substrate processing apparatus 1, and the pair of heat treatment towers 22 and 23 are on the rear side (on the (+Y) side) thereof. Additionally, a thermal barrier not shown is provided on the front side of the pair of heat treatment towers 22 and 23. Thus, the thermal effect of the pair of heat treatment towers 22 and 23 upon the bottom coating processor 21 is avoided by spacing the bottom coating processor 21 apart from the pair of heat treatment towers 22 and 23 and by providing the thermal barrier.

As shown in FIG. 2, the bottom coating processor 21 includes four coating processing units BRC similar in construction to each other and arranged in vertically stacked relation. Each of the coating processing units BRC includes a spin chuck 26 for rotating a substrate W in a substantially horizontal plane while holding the substrate W in a substantially horizontal position under suction, a coating nozzle 27 for applying a coating solution for the anti-reflective film onto the substrate W held on the spin chuck 26, a spin motor (not shown) for rotatably driving the spin chuck 26, a cup (not shown) surrounding the substrate W held on the spin chuck 26, and the like.

As shown in FIG. 3, the heat treatment tower 22 includes two heating units HP for heating a substrate W up to a predetermined temperature, two cooling units CP for cooling a heated substrate W down to a predetermined temperature and maintaining the substrate W at the predetermined temperature, and three adhesion promotion processing units AHL for heat-treating a substrate W in a vapor atmosphere of HMDS (hexamethyldisilazane) to promote the adhesion of the resist film to the substrate W. The two heating units HP, the two cooling units CP, and the three adhesion promotion processing units AHL are arranged in vertically stacked relation in the heat treatment tower 22. The heat treatment tower 23, on the other hand, includes two heating units HP and two cooling units CP which are arranged in vertically stacked relation. Each of the heating units HP and the adhesion promotion processing units AHL includes a hot plate for heating a substrate W by placing the substrate W thereon. Each of the cooling units CP includes a cooling plate for cooling a substrate W by placing the substrate thereon. The locations indicated by the cross marks (x) in FIG. 3 are occupied by a piping and wiring section or reserved as empty space for future addition of processing units (the same applies to other heat treatment towers which will be described later).

As shown in FIG. 4, the transport robot TR1 includes two (upper and lower) transport arms 24a and 24b in proximity to each other for holding a substrate W in a substantially horizontal position. Each of the transport arms 24a and 24b includes a distal end portion of a substantially C-shaped plan configuration, and a plurality of pins projecting inwardly from the inside of the substantially C-shaped distal end portion for supporting the peripheral edge of a substrate W from below. The transport arms 24a and 24b are mounted on a transport head 28. The transport head 28 is upwardly and downwardly movable in a vertical direction (in the Z direction), and rotatable about a vertical axis by a drive mechanism not shown. Also, the transport head 28 is capable of moving the transport arms 24a and 24b back and forth in a horizontal direction independently of each other by means of a slide mechanism not shown. Thus, each of the transport arms 24a and 24b moves upwardly and downwardly, pivots within a horizontal plane, and moves back and forth in the direction of the pivot radius. The transport robot TR1 is therefore capable of causing each of the two transport arms 24a and 24b to independently gain access to the substrate rest parts PASS1 and PASS2, the heat treatment units (the heating units HP, the cooling units CP, and the adhesion promotion processing units AHL) provided in the heat treatment towers 22 and 23, the four coating processing units BRC provided in the bottom coating processor 21, and the substrate rest parts PASS3 and PASS4 to be described later, thereby transferring and receiving substrates W to and from the aforementioned parts and units.

Next, the resist coating block 30 will be described. The resist coating block 30 is provided so as to be sandwiched between the BARC block 20 and the development processing block 40. A partition 25 for closing off the communication of atmosphere is also provided between the resist coating block 30 and the BARC block 20. The partition 25 is provided with the pair of vertically arranged substrate rest parts PASS3 and PASS4 each for placing a substrate W thereon for the transfer of the substrate W between the BARC block 20 and the resist coating block 30. The substrate rest parts PASS3 and PASS4 are similar in construction to the above-mentioned substrate rest parts PASS1 and PASS2.

The upper substrate rest part PASS3 is used for the transport of a substrate W from the BARC block 20 to the resist coating block 30. Specifically, a transport robot TR2 provided in the resist coating block 30 receives the substrate W placed on the substrate rest part PASS3 by the transport robot TR1 in the BARC block 20. The lower substrate rest part PASS4, on the other hand, is used for the transport of a substrate W from the resist coating block 30 to the BARC block 20. Specifically, the transport robot TR1 in the BARC block 20 receives the substrate W placed on the substrate rest part PASS4 by the transport robot TR2 in the resist coating block 30.

The substrate rest parts PASS3 and PASS4 extend through the partition 25. Each of the substrate rest parts PASS3 and PASS4 includes an optical sensor (not shown) for detecting the presence or absence of a substrate W thereon. Based on a detection signal from each of the sensors, a judgment is made as to whether or not the transport robots TR1 and TR2 stand ready to transfer and receive a substrate W to and from the substrate rest parts PASS3 and PASS4.

The resist coating block 30 is a processing block for applying a resist onto a substrate W coated with the anti-reflective film to form a resist film. In this preferred embodiment, a chemically amplified resist is used as the photoresist. The resist coating block 30 includes a resist coating processor 31 for applying the resist onto the anti-reflective film serving as the undercoating film, a pair of heat treatment towers 32 and 33 for performing a heat treatment which accompanies the resist coating process, and the transport robot TR2 for transferring and receiving a substrate W to and from the resist coating processor 31 and the pair of heat treatment towers 32 and 33.

In the resist coating block 30, the resist coating processor 31 and the pair of heat treatment towers 32 and 33 are arranged on opposite sides of the transport robot TR2. Specifically, the resist coating processor 31 is on the front side of the substrate processing apparatus 1, and the pair of heat treatment towers 32 and 33 are on the rear side thereof. Additionally, a thermal barrier not shown is provided on the front side of the pair of heat treatment towers 32 and 33. Thus, the thermal effect of the pair of heat treatment towers 32 and 33 upon the resist coating processor 31 is avoided by spacing the resist coating processor 31 apart from the pair of heat treatment towers 32 and 33 and by providing the thermal barrier.

As shown in FIG. 2, the resist coating processor 31 includes four coating processing units SC similar in construction to each other and arranged in vertically stacked relation. Each of the coating processing units SC includes a spin chuck 36 for rotating a substrate W in a substantially horizontal plane while holding the substrate W in a substantially horizontal position under suction, a coating nozzle 37 for applying a coating solution for the photoresist onto the substrate W held on the spin chuck 36, a spin motor (not shown) for rotatably driving the spin chuck 36, a cup (not shown) surrounding the substrate W held on the spin chuck 36, and the like.

As shown in FIG. 3, the heat treatment tower 32 includes two heating units HP each including a hot plate for heating a substrate W up to a predetermined temperature, and two cooling units CP each including a cooling plate for cooling a heated substrate W down to a predetermined temperature and maintaining the substrate W at the predetermined temperature. The two heating units HP and the two cooling units CP are arranged in vertically stacked relation in the heat treatment tower 32. The heat treatment tower 33, on the other hand, also includes two heating units HP and two cooling units CP which are arranged in vertically stacked relation.

As shown in FIG. 4, the transport robot TR2 is similar in construction to the transport robot TR1, and includes two (upper and lower) transport arms 34a and 34b in proximity to each other for holding a substrate W in a substantially horizontal position. Each of the transport arms 34a and 34b includes a plurality of pins projecting inwardly from the inside of a C-shaped arm portion for supporting the peripheral edge of a substrate W from below. The transport arms 34a and 34b are mounted on a transport head 38. The transport head 38 is upwardly and downwardly movable in a vertical direction (in the Z direction), and rotatable about a vertical axis by a drive mechanism not shown. Also, the transport head 38 is capable of moving the transport arms 34a and 34b back and forth in a horizontal direction independently of each other by means of a slide mechanism not shown. Thus, each of the transport arms 34a and 34b moves upwardly and downwardly, pivots within a horizontal plane, and moves back and forth in the direction of the pivot radius. The transport robot TR2 is therefore capable of causing each of the two transport arms 34a and 34b to independently gain access to the substrate rest parts PASS3 and PASS4, the heat treatment units provided in the heat treatment towers 32 and 33, the four coating processing units SC provided in the resist coating processor 31, and the substrate rest parts PASS5 and PASS6 to be described later, thereby transferring and receiving substrates W to and from the aforementioned parts and units.

Next, the development processing block 40 will be described. The development processing block 40 is provided so as to be sandwiched between the resist coating block 30 and the interface block 50. A partition 35 for closing off the communication of atmosphere is also provided between the development processing block 40 and the resist coating block 30. The partition 35 is provided with the pair of vertically arranged substrate rest parts PASS5 and PASS6 each for placing a substrate W thereon for the transfer of the substrate W between the resist coating block 30 and the development processing block 40. The substrate rest parts PASS5 and PASS6 are similar in construction to the above-mentioned substrate rest parts PASS1 and PASS2.

The upper substrate rest part PASS5 is used for the transport of a substrate W from the resist coating block 30 to the development processing block 40. Specifically, a transport robot TR3 provided in the development processing block 40 receives the substrate W placed on the substrate rest part PASS5 by the transport robot TR2 in the resist coating block 30. The lower substrate rest part PASS6, on the other hand, is used for the transport of a substrate W from the development processing block 40 to the resist coating block 30. Specifically, the transport robot TR2 in the resist coating block 30 receives the substrate W placed on the substrate rest part PASS6 by the transport robot TR3 in the development processing block 40.

The substrate rest parts PASS5 and PASS6 extend through the partition 35. Each of the substrate rest parts PASS5 and PASS6 includes an optical sensor (not shown) for detecting the presence or absence of a substrate W thereon. Based on a detection signal from each of the sensors, a judgment is made as to whether or not the transport robots TR2 and TR3 stand ready to transfer and receive a substrate W to and from the substrate rest parts PASS5 and PASS6.

The development processing block 40 is a processing block for performing a development process on a substrate W subjected to an exposure process. The development processing block 40 includes a development processor 41 for applying a developing solution onto a substrate W exposed in a pattern to perform the development process, a pair of heat treatment towers 42 and 43 for performing a heat treatment subsequent to the development process, and the transport robot TR3 for transferring and receiving a substrate W to and from the development processor 41 and the pair of heat treatment towers 42 and 43.

As shown in FIG. 2, the development processor 41 includes five development processing units SD similar in construction to each other and arranged in vertically stacked relation. Each of the development processing units SD includes a spin chuck 46 for rotating a substrate W in a substantially horizontal plane while holding the substrate W in a substantially horizontal position under suction, a nozzle 47 for applying the developing solution onto the substrate W held on the spin chuck 46, a spin motor (not shown) for rotatably driving the spin chuck 46, a cup (not shown) surrounding the substrate W held on the spin chuck 46, and the like.

As shown in FIG. 3, the heat treatment tower 42 includes two heating units HP each including a hot plate for heating a substrate W up to a predetermined temperature, and two cooling units CP each including a cooling plate for cooling a heated substrate W down to a predetermined temperature and for maintaining the substrate W at the predetermined temperature. The two heating units HP and the two cooling units CP are arranged in vertically stacked relation in the heat treatment tower 42. The heat treatment tower 43, on the other hand, also includes two heating units HP and two cooling units CP which are arranged in vertically stacked relation.

The pair of vertically arranged substrate rest parts PASS7 and PASS8 in proximity to each other for the transfer of a substrate W between the development processing block 40 and the interface block 50 are incorporated in the heat treatment tower 43. The upper substrate rest part PASS7 is used for the transport of a substrate W from the development processing block 40 to the interface block 50. Specifically, a transport robot TR4 provided in the interface block 50 receives the substrate W placed on the substrate rest part PASS7 by the transport robot TR3 in the development processing block 40. The lower substrate rest part PASS8, on the other hand, is used for the transport of a substrate W from the interface block 50 to the development processing block 40. Specifically, the transport robot TR3 in the development processing block 40 receives the substrate W placed on the substrate rest part PASS8 by the transport robot TR4 in the interface block 50. Each of the substrate rest parts PASS7 and PASS8 includes both an open side facing the transport robot TR3 in the development processing block 40 and an open side facing the transport robot TR4 in the interface block 50.

The transport robot TR3 includes two (upper and lower) transport arms 44a and 44b in proximity to each other for holding a substrate W in a substantially horizontal position. Each of the transport arms 44a and 44b includes a plurality of pins projecting inwardly from the inside of a C-shaped arm portion for supporting the peripheral edge of a substrate W from below. The transport arms 44a and 44b are mounted on a transport head 48. The transport head 48 is upwardly and downwardly movable in a vertical direction (in the Z direction), and rotatable about a vertical axis by a drive mechanism not shown. Also, the transport head 48 is capable of moving the transport arms 44a and 44b back and forth in a horizontal direction independently of each other by means of a slide mechanism not shown. Thus, each of the transport arms 44a and 44b moves upwardly and downwardly, pivots within a horizontal plane, and moves back and forth in the direction of the pivot radius. The transport robot TR3 is therefore capable of causing each of the two transport arms 44a and 44b to independently gain access to the substrate rest parts PASS5 and PASSE, the heat treatment units provided in the heat treatment towers 42 and 43, the five development processing units SD provided in the development processor 41, and the substrate rest parts PASS7 and PASS8 in the heat treatment tower 43, thereby transferring and receiving substrates W to and from the aforementioned parts and units.

Next, the interface block 50 will be described. The interface block 50 is a processing block provided adjacent to the development processing block 40. The interface block 50 transfers an unexposed substrate W coated with the resist film to the exposure unit EXP which is an external apparatus separate from the substrate processing apparatus 1. Also, the interface block 50 receives an exposed substrate W from the exposure unit EXP to transfer the exposed substrate W to the development processing block 40.

Figure 5:
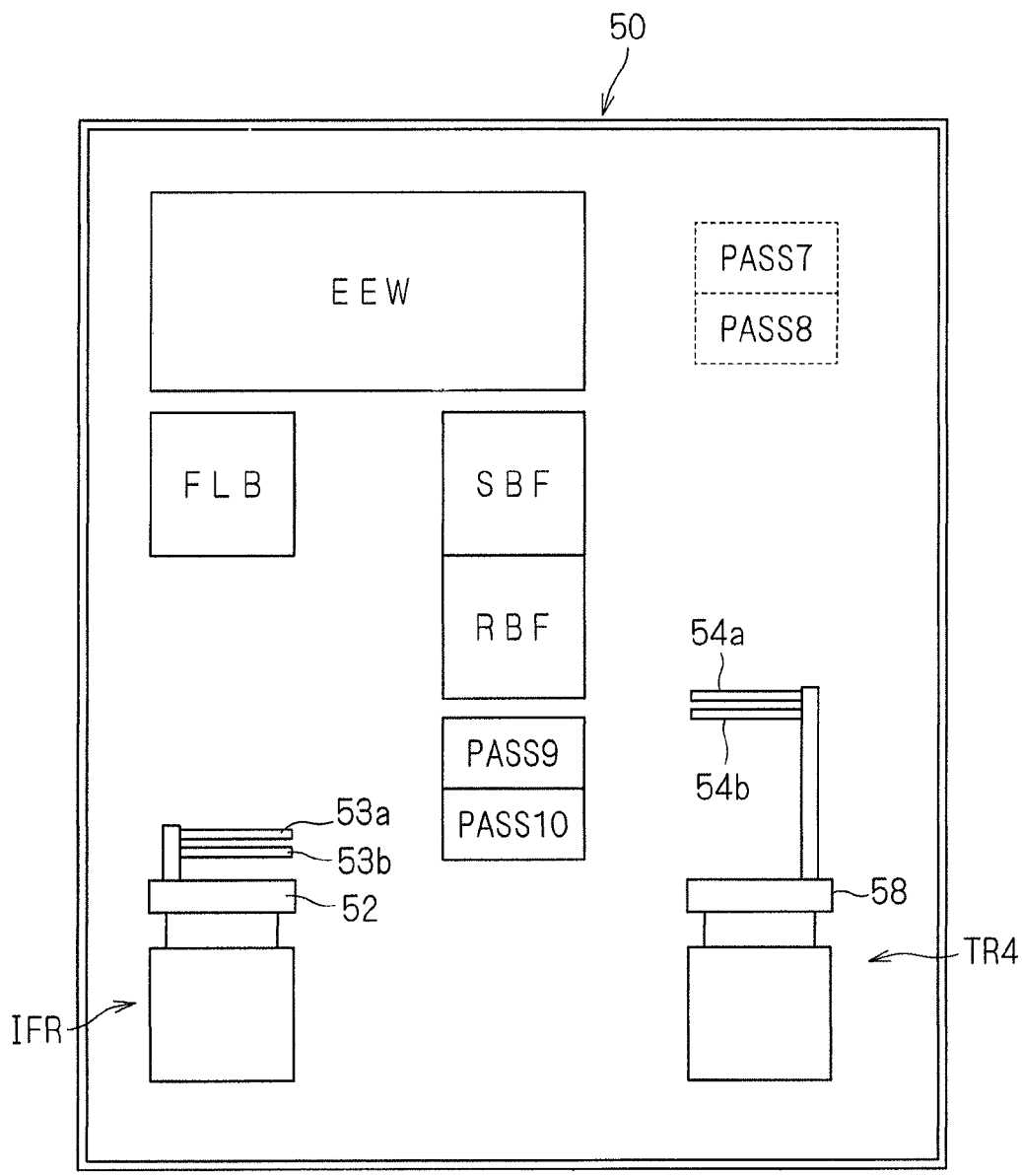
FIG. 5 is a side view of an interface block in the substrate processing apparatus of FIG. 1.

FIG. 5 is a side view of the interface block 50. The interface block 50 includes a transport mechanism IFR for transferring and receiving a substrate W to and from the exposure unit EXP, and the transport robot TR4 for transferring and receiving a substrate W to and from the heat treatment tower 43 in the development processing block 40. The interface block 50 further includes an edge exposure unit EEW for exposing a peripheral edge portion of a substrate W coated with the resist film to light, and a single flash bake unit FLB for irradiating a surface of a substrate W with flashes of light to momentarily heat the surface of the substrate W.

As shown in FIG. 2, the edge exposure unit EEW includes a spin chuck 56 for rotating a substrate W in a substantially horizontal plane while holding the substrate W in a substantially horizontal position under suction, a light irradiator 57 for exposing the peripheral edge of the substrate W held on the spin chuck 56 to light, and the like. The edge exposure unit EEW is provided in the topmost part of the interface block 50, and the transport robot TR4 transfers and receives a substrate W to and from this processing unit.

The flash bake unit FLB is provided in a space under the edge exposure unit EEW and in a range accessible by the transport mechanism IFR. The detailed configuration of the flash bake unit FLB will be further described later. The transport mechanism IFR transfers and receives a substrate W to and from the flash bake unit FLB.

A send buffer SBF for the sending of substrates W, a return buffer RBF for the return of substrates W, and the pair of substrate rest parts PASS9 and PASS10 are arranged in vertically stacked relation in a space under the edge exposure unit EEW and between the transport robot TR4 and the transport mechanism IFR. The upper substrate rest part PASS9 is used for the transfer of a substrate W from the transport robot TR4 to the transport mechanism IFR. The lower substrate rest part PASS10 is used for the transfer of a substrate W from the transport mechanism IFR to the transport robot TR4.

The return buffer RBF is provided to temporarily store an exposed substrate W subjected to a post-exposure bake process in the flash bake unit FLB if the development processing block 40 is unable to perform the development process on the exposed substrate W because of some sort of malfunction and the like. The send buffer SBF is provided to temporarily store an unexposed substrate W prior to the exposure process if the exposure unit EXP is unable to accept the unexposed substrate W. Each of the return buffer RBF and the send buffer SBF includes a cabinet capable of storing multiple substrates W in tiers. The transport robot TR4 gains access to the return buffer RBF, and the transport mechanism IFR gains access to the send buffer SBF.

The transport robot TR4 provided adjacent to the heat treatment tower 43 of the development processing block 40 is similar in construction to the transport robots TR1 to TR3, and includes two (upper and lower) transport arms 54a and 54b in proximity to each other for holding a substrate W in a substantially horizontal position. Each of the transport arms 54a and 54b includes a plurality of pins projecting inwardly from the inside of a C-shaped arm portion for supporting the peripheral edge of a substrate W from below. The transport arms 54a and 54b are mounted on a transport head 58. The transport head 58 is upwardly and downwardly movable in a vertical direction (in the Z direction), and rotatable about a vertical axis by a drive mechanism not shown. Also, the transport head 58 is capable of moving the transport arms 54a and 54b back and forth in a horizontal direction independently of each other by means of a slide mechanism not shown.

The transport mechanism IFR includes a movable base 52 movable upwardly and downwardly and rotatable about a vertical axis, and two holding arms 53a and 53b mounted on the movable base 52 and each for holding a substrate W in a horizontal position. The holding arms 53a and 53b are slidable forwardly and backwardly independently of each other. Thus, each of the holding arms 53a and 53b moves upwardly and downwardly, pivots within a horizontal plane, and moves back and forth in the direction of the pivot radius.

The exposure unit EXP receives an unexposed substrate W subjected to the resist coating process in the substrate processing apparatus 1 from the transport mechanism IFR to perform an exposure process on the substrate W. The substrate W subjected to the exposure process in the exposure unit EXP is received by the transport mechanism IFR. The exposure unit EXP according to this preferred embodiment performs an exposure process on a substrate W with a chemically amplified resist film formed thereon by using excimer laser. The exposure unit EXP may be of the type which supports what is called an "immersion exposure process" in which an exposure process is performed under such a condition that a liquid with a high refractive index (e.g., deionized water with a refractive index n of 1.44) is filled in a space between a projection optical system and a substrate W. Also, the exposure unit EXP may be of the type which performs an exposure process in a vacuum, such as electron beam exposure and EUV (extreme ultraviolet) exposure.

Figure 6:
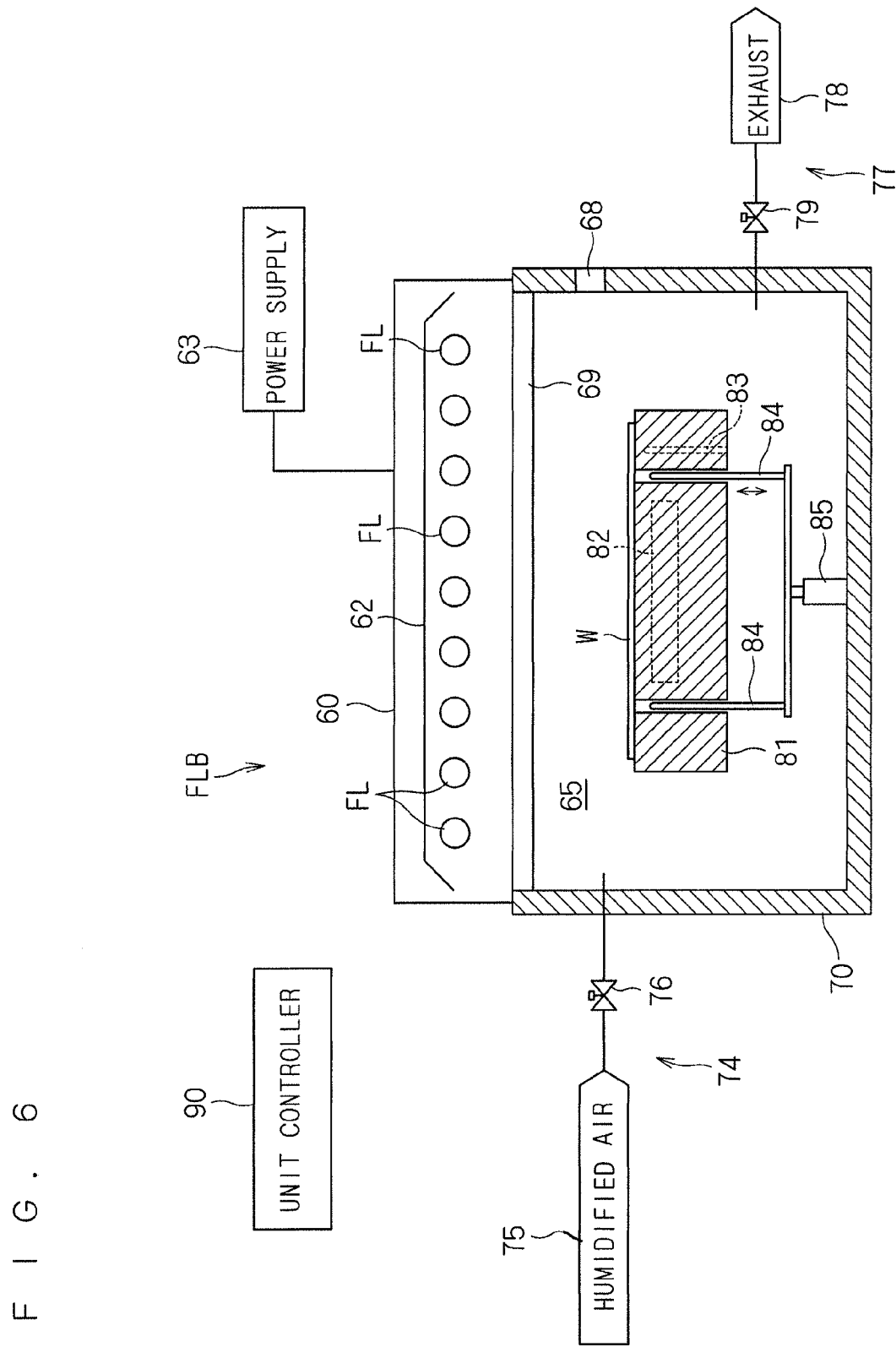
FIG. 6 is a view showing principal parts of a flash bake unit.

Next, the flash bake unit FLB provided in the interface block 50 will be described. FIG. 6 is a view showing principal parts of the flash bake unit FLB. The flash bake unit FLB is a heat treatment unit for performing the post-exposure bake process on an exposed substrate W by irradiating the substrate W with flashes of light. The flash bake unit FLB includes a chamber 70 for receiving a substrate W therein, a cooling plate 81 for placing and holding a substrate W thereon within the chamber 70, an exhaust part 77 for exhausting air from the chamber 70, a humidified air supply part 74 for supplying controlled humidified air through chemical filter into the chamber 70, and a flash irradiation part 60 for irradiating a substrate W with flashes of light. The flash bake unit FLB further includes a unit controller 90 for controlling these components to cause the components to perform the post-exposure bake process.

The chamber 70 is an enclosure provided under the flash irradiation part 60 and capable of receiving a substrate W therein. A chamber window 69 is mounted in the top opening of the chamber 70 to close the top opening. A space surrounded by the side and bottom walls of the chamber 70 and the chamber window 69 is defined as a heat treatment space 65. The chamber window 69 which constitutes a ceiling portion of the chamber 70 is a plate-like member made of quartz, and serves as a quartz window that transmits flashes of light emitted from the flash irradiation part 60 therethrough into the heat treatment space 65. The transmission spectrum of quartz decreases abruptly at a wavelength less than 300 nm. Thus, the chamber window 69 made of quartz also serves as a filter for removing light with a wavelength less than 300 nm from flashes of light directed from flash lamps FL onto a substrate W in the heat treatment space 65.

The chamber 70 has a side wall provided with a transport opening 68 for the transport of a substrate W therethrough into and out of the chamber 70. The transport opening 68 is openable and closable by a shutter not shown. When the transport opening 68 is open, the transport mechanism IFR is allowed to transport a substrate W into and out of the chamber 70. When the transport opening 68 is closed, the heat treatment space 65 is an enclosed space so that the ventilation of air between the heat treatment space 65 and the outside is interrupted.

The cooling plate 81 is a generally disk-shaped member made of metal (e.g., aluminum) and incorporating cooling mechanisms 82. The cooling plate 81 places a substrate W thereon within the chamber 70 to hold the substrate W in a horizontal position (in such a position that the normal to a main surface of the substrate W extends in a vertical direction). Water cooled tubes or Peltier devices may be used as the cooling mechanisms 82. The cooling mechanisms 82 are disposed at a uniform density at least in a region of the cooling plate 81 opposed to a substrate W placed thereon. This enables the cooling mechanisms 82 to cool the region uniformly. The cooling temperature of the cooling mechanisms 82 is under the control of the unit controller 90, and is controlled at 23° C. which is normal room temperature in the field of semiconductor manufacturing techniques according to this preferred embodiment.

A temperature sensor 83 constructed using a thermocouple is provided inside the cooling plate 81. The temperature sensor 83 measures the temperature of part of the cooling plate 81 close to the upper surface thereof. The result of measurement made by the temperature sensor 83 is transmitted to the unit controller 90. The cooling mechanisms 82 are controlled by the unit controller 90 so that the temperature of the cooling plate 81 measured by the temperature sensor 83 reaches a previously set predetermined temperature (23° C. in this preferred embodiment). In other words, the unit controller 90 effects feedback control of the temperature of the cooling plate 81, based on the result of measurement of the temperature sensor 83. It should be noted that a plurality of temperature sensors 83 may be provided in the region of the cooling plate 81 opposed to a substrate W placed thereon.

Multiple (at least three) proximity balls not shown are disposed on the upper surface of the cooling plate 81. The proximity balls are made of a material such as alumina ($Al_2O_3$), for example, and are provided in such a manner that the upper ends thereof protrude slightly from the upper surface of the cooling plate 81. Thus, a slight space known as what is called a proximity gap is created between the back surface of a substrate W and the upper surface of the cooling plate 81 when the substrate W is supported by the multiple proximity balls. Alternatively, a susceptor may be provided on the upper surface of the cooling plate 81 so that a substrate W is supported through the susceptor.

The substrate W placed on the cooling plate 81 through the use of the multiple proximity balls is controlled at room temperature (23° C.) by the cooling plate 81. Specifically, when the temperature of the substrate W is higher than room temperature, the substrate W is cooled down to room temperature. When the temperature of the substrate W is near room temperature, the cooling plate 81 maintains the temperature of the substrate W at room temperature with stability.

The cooling plate 81 is provided with a plurality of (in this preferred embodiment, three) lift pins 84 extendable out of and retractable into the upper surface thereof. The vertical positions of the upper ends of the three lift pins 84 are included in the same horizontal plane. The three lift pins 84 are moved up and down in a vertical direction together by an air cylinder 85. Each of the lift pins 84 is moved up and down along the interior of a through hole extending vertically through the cooling plate 81. As the air cylinder 85 moves the three lift pins 84 upwardly, the tips of the respective lift pins 84 protrude from the upper surface of the cooling plate 81. On the other hand, as the air cylinder 85 moves the three lift pins 84 downwardly, the tips of the respective lift pins 84 are retracted into the respective through holes of the cooling plate 81.

The humidified air supply part 74 supplies humidified air into the chamber 70. The humidified air supply part 74 includes a humidified air supply source 75, and a valve 76. By opening the valve 76, humidified air is supplied into the heat treatment space 65 of the chamber 70. The humidified air supply source 75 incorporates a freezer, a heater, a humidifier, a chemical filter and the like, and is structured to be able to supply humidified air which is temperature- and humidity-controlled and which is free of basic substances.

The exhaust part 77 includes an exhauster 78, and a valve 79. By opening the valve 79, an atmosphere in the chamber 70 is exhausted. A utility exhaust system in a factory in which the substrate processing apparatus 1 is installed may be used as the exhauster 78.

The flash irradiation part 60 is provided over the chamber 70. The flash irradiation part 60 includes a light source comprised of a plurality of flash lamps FL, and a reflector 62 provided so as to cover the light source from above. The flash irradiation part 60 directs flashes of light from the flash lamps FL through the chamber window 69 made of quartz onto a substrate W held by the cooling plate 81 within the chamber 70.

The flash lamps FL, each of which is a rod-shaped lamp having an elongated cylindrical shape, are arranged in a plane so that the longitudinal directions of the respective flash lamps FL are in parallel with each other along the main surface of a substrate W held by the cooling plate 81 (that is, in a horizontal direction). Thus, a plane defined by the arrangement of the flash lamps FL is also a horizontal plane.

The flash irradiation part 60 is connected to a power supply unit 63. The power supply unit 63 supplies power to each of the flash lamps FL. The power supply unit 63 includes a capacitor which stores an electric charge for the emission of flashes of light, and a coil which adjusts the waveform of current flowing through the flash lamps FL.

In this preferred embodiment, xenon flash lamps are used as the flash lamps FL. Each of the xenon flash lamps FL includes a rod-shaped glass tube (discharge tube) containing xenon gas sealed therein and having positive and negative electrodes provided on opposite ends thereof and connected to the capacitor of the power supply unit 63, and a trigger electrode mounted on the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, an electrical discharge between the electrodes causes electricity stored in the capacitor to flow momentarily in the glass tube, and xenon atoms or molecules are excited at this time to cause light emission. The xenon flash lamps FL have the property of being capable of emitting much intenser light than a light source that stays lit continuously because the electrostatic energy previously stored in the capacitor is converted into an ultrashort light pulse ranging from 0.1 to 100 milliseconds.

Also, the reflector 62 is provided over the plurality of flash lamps FL so as to cover all of the flash lamps FL. A fundamental function of the reflector 62 is to reflect flashes of light emitted from the plurality of flash lamps FL toward the heat treatment space 65. The reflector 62 is a plate made of an aluminum alloy. A surface of the reflector 62 (a surface which faces the flash lamps FL) is roughened by abrasive blasting to produce a stain finish thereon.

The unit controller 90 controls the aforementioned various operating mechanisms provided in the flash bake unit FLB. The unit controller 90 is similar in hardware construction to typical computers. Specifically, the unit controller 90 includes a CPU for performing various computation processes, a ROM or read-only memory for storing a basic program therein, a RAM or readable/writable memory for storing various pieces of information therein, a magnetic disk for storing control applications and data therein, and the like. The CPU in the unit controller 90 executes a predetermined processing program, whereby the processes in the flash bake unit FLB proceed. The unit controller 90 may be provided as a lower-level controller that is at a level lower than that of a main controller which controls the entire substrate processing apparatus 1.

Next, a procedure for substrate processing in the substrate processing apparatus 1 having the aforementioned configuration will be described. Description will be given herein first briefly on a general procedure in the substrate processing apparatus 1, and then on the processes in the flash bake unit FLB.

Unprocessed substrates W stored in a cassette C are transported from the outside of the substrate processing apparatus 1 into the indexer block 10 by an AGV (automatic guided vehicle) and the like. Subsequently, the unprocessed substrates W are transferred outwardly from the indexer block 10. Specifically, the indexer robot IR takes an unprocessed substrate W out of a predetermined cassette C, and places the unprocessed substrate W onto the upper substrate rest part PASS1. After the unprocessed substrate W is placed on the substrate rest part PASS1, the transport robot TR1 in the BARC block 20 receives the unprocessed substrate W, and transports the unprocessed substrate W to one of the adhesion promotion processing units AHL in the heat treatment tower 22. In the adhesion promotion processing unit AHL, the substrate W is heat-treated in a vapor atmosphere of HMDS, whereby the adhesion of the substrate W is promoted. The transport robot TR1 takes the substrate W subjected to the adhesion promotion process out of the adhesion promotion processing unit AHL, and transports the substrate W to one of the cooling units CP in the heat treatment towers 22 and 23, which in turn cools down the substrate W.

The transport robot TR1 transports the cooled substrate W from the cooling unit CP to one of the coating processing units BRC in the bottom coating processor 21. In the coating processing unit BRC, the coating solution for the anti-reflective film is supplied to a surface of the substrate W so that the surface of the substrate W is spin-coated with the coating solution.

After the completion of the coating process, the transport robot TR1 transports the substrate W to one of the heating units HP in the heat treatment towers 22 and 23. In the heating unit HP, heating the substrate W dries the coating solution to bake the anti-reflective film serving as the undercoat on the substrate W. Thereafter, the transport robot TR1 takes the substrate W out of the heating unit HP, and transports the substrate W to one of the cooling units CP in the heat treatment towers 22 and 23, which in turn cools down the substrate W. The transport robot TR1 places the cooled substrate W onto the substrate rest part PASS3.

After the substrate W coated with the anti-reflective film is placed on the substrate rest part PASS3, the transport robot TR2 in the resist coating block 30 receives the substrate W, and transports the substrate W to one of the cooling units CP in the heat treatment towers 32 and 33, which in turn controls the substrate W at a predetermined temperature. Subsequently, the transport robot TR2 transports the temperature-controlled substrate W to one of the coating processing units SC in the resist coating processor 31. In the coating processing unit SC, the substrate W is spin-coated with the coating solution for the resist film. In this preferred embodiment, a chemically amplified resist is used as the resist.

After the completion of the resist coating process, the transport robot TR2 transports the substrate W out of the coating processing unit SC to one of the heating units HP in the heat treatment towers 32 and 33. In the heating unit HP, the heating (post-applied bake) of the substrate W dries the coating solution to form the resist film on the substrate W. Thereafter, the transport robot TR2 takes the substrate W out of the heating unit HP, and transports the substrate W to one of the cooling units CP in the heat treatment towers 32 and 33, which in turn cools down the substrate W. Then, the transport robot TR2 places the cooled substrate W onto the substrate rest part PASS5.

After the substrate W coated with the resist film is placed on the substrate rest part PASS5, the transport robot TR3 in the development processing block 40 receives the substrate W, and places the substrate W onto the substrate rest part PASS7 without any processing of the substrate W. Then, the transport robot TR4 in the interface block 50 receives the substrate W placed on the substrate rest part PASS7, and transports the substrate W into the edge exposure unit EEW. In the edge exposure unit EEW, a peripheral edge portion of the substrate W is exposed to light (an edge exposure process). The transport robot TR4 places the substrate W subjected to the edge exposure process onto the substrate rest part PASS9. The transport mechanism IFR receives the substrate W placed on the substrate rest part PASS9, and transports the substrate W into the exposure unit EXP. The substrate W transported into the exposure unit EXP is subjected to the pattern exposure process. Because the chemically amplified resist is used in this preferred embodiment, an acid is formed by a photochemical reaction in the exposed portion of the resist film formed on the substrate W.

The exposed substrate W subjected to the pattern exposure process is transported from the exposure unit EXP back to the interface block 50 again. The transport mechanism IFR transports the substrate W to the flash bake unit FLB. In the flash bake unit FLB, the post-exposure bake process is performed which causes a chemical reaction such as crosslinking, deprotection or decomposition and the like of the resist resin to proceed by using a product formed by the photochemical reaction during the exposure process as an acid catalyst, thereby locally changing the solubility of only the exposed portion of the resist resin in the developing solution, which will be described in detail later.

The substrate W subjected to the post-exposure bake process is cooled down by the cooling plate 81 in the flash bake unit FLB, whereby the above-mentioned chemical reaction stops. Subsequently, the transport mechanism IFR takes the substrate W out of the flash bake unit FLB, and is placed onto the substrate rest part PASS10. After the substrate W subjected to the post-exposure bake process is placed on the substrate rest part PASS10, the transport robot TR4 receives the substrate W, and places the substrate W onto the substrate rest part PASS8 in the heat treatment tower 43.

After the substrate W is placed on the substrate rest part PASS8, the transport robot TR3 in the development processing block 40 receives the substrate W, and transports the substrate W to one of the cooling units CP in the heat treatment towers 42 and 43. In the cooling unit CP, the substrate W subjected to the post-exposure bake process is further cooled down and precisely controlled at a predetermined temperature. Thereafter, the transport robot TR3 takes the substrate W out of the cooling unit CP, and transports the substrate W to one of the development processing units SD in the development processor 41. In the development processing unit SD, the developing solution is applied onto the substrate W to cause the development process to proceed. After the completion of the development process, the transport robot TR3 transports the substrate W to one of the heating units HP in the heat treatment towers 42 and 43, and then transports the substrate W to one of the cooling units CP.

Thereafter, the transport robot TR3 places the substrate W onto the substrate rest part PASS6. The transport robot TR2 in the resist coating block 30 places the substrate W from the substrate rest part PASS6 onto the substrate rest part PASS4 without any processing of the substrate W. Next, the transport robot TR1 in the BARC block 20 places the substrate W from the substrate rest part PASS4 onto the substrate rest part PASS2 without any processing of the substrate W, whereby the substrate W is stored in the indexer block 10. Then, the indexer robot IR stores the processed substrate W placed on the substrate rest part PASS2 into a predetermined cassette C. Thereafter, the cassette C in which a predetermined number of processed substrates W are stored is transported to the outside of the substrate processing apparatus 1. Thus, a series of photolithographic processes are completed.

The processes in the flash bake unit FLB will be further described. FIG. 7 is a flow diagram showing a procedure for the processing of a substrate W in the flash bake unit FLB. FIG. 8 is a graph showing changes in the surface temperature of a substrate W. The unit controller 90 controls the operating mechanisms in the flash bake unit FLB, whereby the procedure for the processing of a substrate W in the flash bake unit FLB proceeds.

First, the heat treatment space 65 is caused to become an enclosed space, and an atmosphere in the chamber 70 is replaced with an atmosphere of humidified air (in Step S1). Specifically, humidified air is supplied from the humidified air supply part 74 into the chamber 70, and the exhaust part 77 exhausts air from the chamber 70 at the same time. Thus, the air in the chamber 70 is replaced with air controlled at predetermined temperature and humidity, so that an atmosphere of humidified air is provided in the heat treatment space 65.

Next, the shutter not shown is opened to open the transport opening 68. Then, the transport mechanism IFR transports a substrate W just subjected to the pattern exposure process through the transport opening 68 into the chamber 70 (in Step S2). Specifically, the holding arm 53a (or 53b) of the transport mechanism IFR having received the substrate W subjected to the pattern exposure process from the exposure unit EXP moves forward through the transport opening 68 into the chamber 70, and stops immediately over the cooling plate 81. Subsequently, the three lift pins 84 move upwardly to receive the substrate W from the holding arm 53a. Thereafter, the holding arm 53a of the transport mechanism IFR moves backward out of the chamber 70, and the transport opening 68 is closed.

After the holding arm 53a of the transport mechanism IFR moves backward out of the chamber 70, the three lift pins 84 supporting the exposed substrate W move downwardly to retract into the respective through holes of the cooling plate 81. In the course of the downward movement of the lift pins 84, the substrate W is transferred from the lift pins 84 to the upper surface of the cooling plate 81 at time t1, and is placed and held in a horizontal position on the upper surface of the cooling plate 81. The temperature of the substrate W at time t1 when the substrate W is transferred to the cooling plate 81 is equal to that of an atmosphere in which the substrate processing apparatus 1 is installed, and is approximately equal to room temperature.

The cooling plate 81 is previously controlled at room temperature (23° C.) by the cooling mechanisms 82. Based on the result of measurement made by the temperature sensor 83, the unit controller 90 controls the cooling mechanisms 82 so that the temperature of the cooling plate 81 reaches 23° C. The lift pins 84 move downward so that the substrate W is placed on the cooling plate 81 controlled at room temperature, whereby the cooling plate 81 starts controlling the temperature of the substrate W at time t1. Thus, the substrate W is temperature-controlled precisely at 23° C. As a result, temperature history uniformity between a plurality of substrates W included in a lot is improved.

After an atmosphere of humidified air is provided in the heat treatment space 65 of the chamber 70 and the substrate W is held on the cooling plate 81 and controlled at 23° C., flashes of light are directed from the flash lamps FL of the flash irradiation part 60 toward the surface of the substrate W held on the cooling plate 81 at time t2 under the control of the unit controller 90 (in Step S3). Part of the flashes of light emitted from the flash lamps FL travel directly toward the heat treatment space 65 of the chamber 70. The remainder of the flashes of light are reflected once from the reflector 62, and then travel toward the heat treatment space 65. The irradiation of the substrate W with such flashes of light achieves the flash heating of the surface of the substrate W.

The flashes of light emitted from the flash lamps FL are intense flashes of light emitted for an extremely short period of time ranging from about 0.1 to about 100 milliseconds because the previously stored electrostatic energy is converted into such ultrashort light pulses. The temperature of the surface of the substrate W irradiated with flashes of light emitted from the flash lamps FL momentarily rises to a treatment temperature T1, and thereafter falls rapidly to room temperature. Such flash heating causes a chemical reaction such as crosslinking, deprotection or decomposition and the like of resist resin to proceed by using active species produced in a film of chemically amplified resist by a photochemical reaction during the pattern exposure process as an acid catalyst. Thus, the post-exposure bake process is performed which locally changes the solubility of only the exposed portion of the resist film in the developing solution. In other words, the irradiation of the substrate W with flashes of light momentarily raises the surface temperature of the substrate W, whereby the post-exposure bake process is performed in this preferred embodiment.

A time interval between the time t2 at which the surface temperature of the substrate W irradiated with flashes of light starts rising and the time t3 at which the surface temperature falls to room temperature is not greater than one second. The irradiation of the substrate W with intense flashes of light from the flash lamps FL even in such a short time of not greater than one second allows the chemical reaction to occur using a catalytic reaction with reliability.

Even after the completion of the post-exposure bake process performed by the irradiation with flashes of light, the substrate W which is continuously held on the cooling plate 81 is cooled and maintained at room temperature (in Step S4). The supply of humidified air from the humidified air supply part 74 into the chamber 70 and the exhaust of air from the chamber 70 by the exhaust part 77 are continued before, during and after the irradiation with flashes of light. Thus, an atmosphere of humidified air is continuously provided in the chamber 70 when the flash heating is performed and the substrate W before and after the flash heating is maintained at room temperature.

At time t4 after a lapse of a predetermined time period, the three lift pins 84 move upwardly to push the substrate W placed on the cooling plate 81 upwardly so that the substrate W is spaced apart from the cooling plate 81. Thereafter, the transport opening 68 is opened again, and the holding arm 53a (or 53b) of the transport mechanism IFR moves forward through the transport opening 68 into the chamber 70, and stops immediately under the substrate W. Subsequently, the lift pins 84 move downwardly, whereby the substrate W is transferred from the lift pins 84 to the holding arm 53a. The holding arm 53a of the transport mechanism IFR having received the substrate W moves backward out of the chamber 70 to thereby transport the substrate W out of the chamber 70. This completes the post-exposure bake process in the flash bake unit FLB (in Step S5).

In this preferred embodiment, the post-exposure bake process is performed on the substrate W subjected to the pattern exposure process by irradiating the substrate W with flashes of light from the flash lamps FL. The flash heating treatment performed by the irradiation with flashes of light requires extremely short treatment time of not greater than one second. The diffusion length of an acid during the post-exposure bake process is expressed as $2(D \cdot t)^{1/2}$ where t is a post-exposure bake process time period, and D is the diffusion coefficient of an acid in a resist film, which is a constant determined by the type of chemically amplified resist and process condition. For the same D of chemically amplified resist, the diffusion length of an acid depends on the post-exposure bake process time period t, so that the diffusion length of an acid increases with the increase in the post-exposure bake process time period t.

In a conventional post-exposure bake process in which a substrate W is placed on a hot plate and is then heated, it takes at least 30 seconds or more for the substrate W to reach a target temperature. In comparison with this, the post-exposure bake process performed by the irradiation with flashes of light requires extremely short time of not greater than one second. This significantly reduces the diffusion length of acid during the post-exposure bake process as compared with the conventional process. The reduction in the diffusion length of acid improves the dimensional accuracy of the pattern exposure process, and also reduces pattern roughness, thereby satisfying the requirement for the recent rapid reduction in pattern dimensions.

Also, an extremely short time period is sufficiently required for the post-exposure bake process performed by the irradiation with flashes of light. This significantly shortens the processing time in the flash bake unit FLB to consequently improve the throughput in the substrate processing apparatus 1.

When the post-exposure bake process requires a short time period, the post-exposure bake process does not determine the rate of the entire substrate processing apparatus 1 in which the single flash bake unit FLB is mounted. For a throughput similar to the conventional one, the number of units mounted in the substrate processing apparatus 1 is significantly reduced. This achieves a compact apparatus size, and also suppresses the increase in power consumption.

There are cases where the temperature of the post-exposure bake process differs depending on the type of chemically amplified resist. For the treatment of substrates W with different types of resist films formed thereon in succession, the post-exposure bake process using the conventional hot plate requires an appropriate amount of time to change the plate temperature to a desired temperature, and accordingly requires the same amount of waiting time. This gives rise to the reduction in throughput. The flash bake unit FLB according to this preferred embodiment, on the other hand, is capable of changing the intensity of flashes of light emitted from the flash lamps FL to easily change the heating temperature of substrates W, thereby performing the post-exposure bake process on substrates W with different types of resist films formed thereon in succession without any waiting time for temperature changes. As a result, this preferred embodiment prevents the reduction in the throughput of the substrate processing apparatus 1 even when the substrates W with different types of resist films formed thereon are treated in succession. It should be noted that the intensity of flashes of light emitted from the flash lamps FL may be changed, for example, by changing the charging voltage of the capacitor in the power supply unit 63.

Additionally, the flash bake unit FLB according to this preferred embodiment includes the cooling plate 81 which in turn precisely controls the substrate W prior to the irradiation with flashes of light at room temperature. This provides temperature history uniformity between a plurality of substrates W to be treated in succession to achieve an improvement in dimensional accuracy of the pattern after the post-exposure bake process and the reduction in pattern roughness.

The cooling plate 81 also has the function of cooling the substrate W immediately after the irradiation with flashes of light to thereby stop the chemical reaction using an acid catalyst with reliability. The cooling of the substrate W immediately after the irradiation with flashes of light by using the cooling plate 81 allows a constant time interval between the time t2 at which the surface temperature of the substrate W irradiated with flashes of light starts rising and the time t3 at which the surface temperature falls to room temperature. This provides a fixed temperature history to improve the dimensional accuracy of the pattern after the post-exposure bake process. The provision of the cooling plate 81 in the flash bake unit FLB also prevents the accumulation of heat in a member which holds substrates W to provide temperature history uniformity between a plurality of substrates W.

Also in this preferred embodiment, the post-exposure bake process is performed on a substrate W by irradiating the substrate W with flashes of light. This allows the treatment of the entire surface of the substrate W by one operation at a time. This prevents the reduction in uniformity of pattern dimensions resulting from a difference in treatment time.

Many chemically amplified resists react to light with a wavelength less than 300 nm. The flash bake unit FLB according to this preferred embodiment includes the chamber window 69 made of quartz to remove light with a wavelength less than 300 nm from flashes of light directed from the flash lamps FL onto a substrate W in the heat treatment space 65. Although flashes of light emitted from xenon flash lamps FL contain little light with a wavelength less than 300 nm, the chamber window 69 made of quartz removes light with a wavelength less than 300 nm from the flashes of light to prevent the resist film from reacting to the flashes of light during the post-exposure bake process with reliability.

In this preferred embodiment, the flash bake unit FLB for performing the post-exposure bake process is disposed in the interface block 50, and the transport mechanism IFR is used to transfer and receive a substrate W to and from the flash bake unit FLB. Thus, immediately after the transport mechanism IFR receives the exposed substrate W subjected to the pattern exposure process from the exposure unit EXP, the exposed substrate W is transported to the flash bake unit FLB and subjected to the post-exposure bake process. As a result, this minimizes a time interval (a PED or post-exposure delay) between the completion of the pattern exposure process and the start of the post-exposure bake process to improve the dimensional accuracy of the pattern after the post-exposure bake process.

Although the preferred embodiment according to the present invention has been described hereinabove, various modifications in addition to the above may be made therein without departing from the spirit and scope of the present invention. For example, the interface block 50 in the substrate processing apparatus 1 includes the single flash bake unit FLB. The present invention, however, is not limited to this.

The interface block 50 may include a plurality of flash bake units FLB. In this case, some of the flash bake units FLB may be prepared as spare units.

Since the treatment time in the flash bake unit FLB for performing the post-exposure bake process by the irradiation with flashes of light is significantly short, even the single flash bake unit FLB does not determine the rate of the entire substrate processing apparatus 1. When the single flash bake unit FLB is sufficient, the flash bake unit FLB is allowed to be installed in the interface block 50 having even a small amount of available space. This allows the transport mechanism IFR to transport the exposed substrate W received from the exposure unit EXP immediately to the flash bake unit FLB, thereby reducing the PED.

The flash bake unit FLB for performing the post-exposure bake process may be disposed in the heat treatment tower 43 of the development processing block 40, rather than in the interface block 50. In this case, the exposed substrate W transferred from the exposure unit EXP to the transport mechanism IFR is transported to the flash bake unit FLB by the transport robot TR4. In other words, the configuration of the substrate processing apparatus 1 is not limited to that shown in FIGS. 1 to 5, but the substrate processing apparatus 1 in which the flash bake unit FLB for performing the post-exposure bake process on the exposed substrate W is incorporated in any position may have various arrangements and configurations.

In the above-mentioned preferred embodiment, the substrate W subjected to the post-exposure bake process in the flash bake unit FLB is transported to one of the cooling units CP in the heat treatment towers 42 and 43 and is precisely temperature-controlled at a predetermined temperature in the cooling unit CP. However, the temperature control process in the cooling unit CP may be dispensed with because the temperature control is effected also by the cooling plate 81 of the flash bake unit FLB after the irradiation with flashes of light.

Also, a switching element such as an IGBT (insulated-gate bipolar transistor) may be provided in the power supply unit 63 to control the current flowing through the flash lamps FL, thereby changing the intensity of flashes of light emitted from the flash lamps FL, so that the treatment temperature T1 during the flash heating is changed. Alternatively, two types of capacitors having different capacitances may be provided in the power supply unit 63, in which case the switching between the two types of capacitors is done to change the intensity of flashes of light emitted from the flash lamps FL.

Although the post-exposure bake process is performed by the irradiation with flashes of light in the above-mentioned preferred embodiment, the present invention is not limited to this. Other heating treatments in the substrate processing apparatus 1 may be performed by the irradiation with flashes of light. For example, the heating treatment (post-applied bake) for heating a substrate W coated with a coating solution for an anti-reflective film or a resist film to bake the film may be performed by irradiating the substrate W with flashes of light in the flash bake unit FLB. Further, a heating treatment for drying may be performed by irradiating a substrate W subjected to the development process with flashes of light.

Moreover, the substrate W to be processed or treated by the heat treatment technique according to the present invention is not limited to a semiconductor wafer, but may be a glass substrate for use in a liquid crystal display device, and a substrate for a solar cell.

While the invention has been described in detail, the foregoing description is in all aspects illustrative and not restrictive. It is understood that numerous other modifications and variations can be devised without departing from the scope of the invention.

What is claimed is:

1. A method of heat-treating an exposed substrate having an exposed surface obtained by a pattern exposure process, by performing a post-exposure bake process on the exposed substrate, comprising the steps of:
    (a) putting a substrate into a chamber after a chemically amplified resist film formed on the exposed surface of the substrate has been exposed to light;
    (b) simultaneously irradiating the entirety of the exposed surface of said substrate put in said chamber with flashes of light to perform a post-exposure bake process; and
    (c) causing a chemical reaction of at least one of crosslinking, deprotection and decomposition of the resist film to proceed by using active species produced in said chemically amplified resist film by a photochemical reaction during the pattern exposure process as an acid catalyst.

2. The method according to claim 1, further comprising the steps of:
    (c) exhausting air from said chamber; and
    (d) supplying humidified air into said chamber.

3. The method according to claim 1, wherein
    said substrate is irradiated with flashes of light in said step (b) while being held on a cooling plate in said chamber.

4. The method according to claim 3, wherein
    said substrate is held on said cooling plate continuously before, during and after the irradiation with flashes of light.

5. The method according to claim 1, wherein
    the time for heating treatment by the irradiation with flashes of light in said step (b) is not greater than one second.

6. The method according to claim 1, wherein
    light with a wavelength less than 300 nm is removed from the flashes of light directed onto the surface of said substrate in said step (b).

7. A heat treatment apparatus for performing a post-exposure bake process on an exposed substrate having an exposed surface obtained by a pattern exposure process, comprising:
    a chamber configured for receiving therein a substrate having a surface provided with a chemically amplified resist film exposed to light;
    a cooling plate configured for placing and holding said substrate thereon in said chamber;
    an exhaust part configured for exhausting air from said chamber;
    a humidified air supply part configured for supplying humidified air into said chamber;
    a flash lamp configured for simultaneously irradiating the entirety of the exposed surface of said substrate held on said cooling plate with flashes of light to cause a chemical reaction of at least one of crosslinking, deprotection and decomposition of the resist film to proceed by using active species produced in said chemically amplified resist film by a photochemical reaction during the pattern exposure process as an acid catalyst; and
    a filter configured for removing light with a wavelength less than 300 nm from the flashes of light directed from said flash lamp onto said substrate.

* * * * *